(12) United States Patent
Takaoka et al.

(10) Patent No.: US 12,738,920 B2
(45) Date of Patent: Sep. 15, 2026

(54) SURFACE ACOUSTIC WAVE DEVICE

(71) Applicants: XIAMEN SANAN INTEGRATED CIRCUIT CO., LTD., Xiamen (CN); SANAN JAPAN TECHNOLOGY CORPORATION, Tokyo (JP); FUJIAN JING'AN OPTOELECTRONICS CO., LTD., Quanzhou (CN)

(72) Inventors: Yoshiaki Takaoka, Tokyo (JP); Ming-Hui Fang, Xiamen (CN)

(73) Assignees: XIAMEN SANAN INTEGRATED CIRCUIT CO., LTD., Xiamen (CN); SANAN JAPAN TECHNOLOGY CORPORATION, Tokyo (JP); FUJIAN JING'AN OPTOELECTRONICS CO., LTD., Quanzhou (CN)

( * ) Notice: Subject to any disclaimer, the term of this patent is extended or adjusted under 35 U.S.C. 154(b) by 931 days.

(21) Appl. No.: 17/997,853

(22) PCT Filed: May 24, 2021

(86) PCT No.: PCT/CN2021/095543
§ 371 (c)(1),
(2) Date: Nov. 3, 2022

(87) PCT Pub. No.: WO2021/238873
PCT Pub. Date: Dec. 2, 2021

(65) Prior Publication Data

US 2023/0179169 A1 Jun. 8, 2023

(30) Foreign Application Priority Data

May 25, 2020 (CN) ........................ 202010446767.2

(51) Int. Cl.
*H03H 9/00* (2006.01)
*H03H 9/02* (2006.01)
*H03H 9/25* (2006.01)

(52) U.S. Cl.
CPC .... *H03H 9/02834* (2013.01); *H03H 9/02543* (2013.01); *H03H 9/02614* (2013.01); *H03H 9/25* (2013.01)

(58) Field of Classification Search
CPC ........... H03H 9/02834; H03H 9/02543; H03H 9/02614; H03H 9/25; H03H 9/02157;
(Continued)

(56) References Cited

U.S. PATENT DOCUMENTS

2020/0313650 A1* 10/2020 Yamamoto ......... H03H 9/02866
2020/0395914 A1* 12/2020 Okunaga ............ H03H 9/02228

FOREIGN PATENT DOCUMENTS

CN 109417376 A 3/2019

OTHER PUBLICATIONS

Search Report appended to Office Action, Chinese Patent Application No. 202010446767.2, mailed Jun. 14, 2022.
(Continued)

*Primary Examiner* — Julio C. Gonzalez
(74) *Attorney, Agent, or Firm* — Thomas | Horstemeyer, LLP

(57) ABSTRACT

A surface acoustic wave device includes a substrate that has a top surface and that contains a plurality of protrusions protruding from the top surface and spaced apart from each other, an intermediate layer disposed on the substrate so as to fill a recess formed among the protrusions, a piezoelectric layer disposed on the intermediate layer opposite to the substrate, and an electrode layer disposed on the piezoelectric layer opposite to the intermediate layer.

21 Claims, 7 Drawing Sheets

(58) Field of Classification Search
CPC .. H03H 9/02574; H03H 9/02622; H03H 1/00; H03H 9/02818; H03H 9/17
See application file for complete search history.

(56) References Cited

OTHER PUBLICATIONS

Search Report, appended to an Office Action, which was issued to Chinese counterpart application No. 202010446767.2 by the CNIPA on Jun. 14, 2022.

* cited by examiner

SURFACE ACOUSTIC WAVE DEVICE

FIELD

The disclosure relates to an apparatus made of a piezoelectric material, and more particularly to a surface acoustic wave device.

BACKGROUND

Referring to FIG. 1, an earlier-developed surface acoustic wave (SAW) device includes a piezoelectric layer 11, and an electrode layer 12 that is disposed on the piezoelectric layer 11 and that includes an interdigital electrode. Examples of a material suitable for making the piezoelectric layer 11 may include lithium tantalite ($LiTaO_3$) and lithium niobate ($LiNbO_3$), which have a good electromechanical coupling factor ($K^2$) but have a poor temperature stability. That is to say, the abovementioned materials easily expand or shrink with temperature, which results in drift of a resonance frequency of an acoustic wave propagation in the earlier-developed SAW device.

For improving the poor temperature stability of the piezoelectric layer 11, a later-developed SAW device is proposed. Referring to FIG. 2, the later-developed SAW device is similar to the earlier-developed SAW device. However, compared with the earlier-developed SAW device, the later-developed SAW device has a thinner piezoelectric layer 11, and further includes an intermediate layer 14 disposed on the piezoelectric layer 11 opposite to the electrode layer 12, and a substrate 13 disposed on the intermediate layer 14 opposite to the piezoelectric layer 11. In particular, in the later-developed SAW device, the thickness of the piezoelectric layer 11 ranges from 10 μm to 20 μm, the thickness of the electrode layer 12 ranges from 50 nm to 600 nm, the thickness of the substrate 13 ranges from 100 μm to 800 μm, and the thickness of the intermediate layer 14 ranges from 10 nm to 5000 nm. In terms of material composition, the substrate 13 is made of sapphire ($Al_2O_3$), which could inhibit expansion of the piezoelectric layer 11 physically. The intermediate layer 14 made of silicon dioxide could compensate drift of a resonance frequency of the later-developed SAW device since silicon dioxide has a temperature coefficient of resonance frequency, whose value is opposite to that of the piezoelectric layer 11.

Referring to FIGS. 3 and 4, compared with the earlier-developed SAW device, even though the later-developed SAW device inhibits expansion of the piezoelectric layer 11, a plurality of spurious modes are generated above a resonance frequency of a resonator made from the later-developed SAW device, which is due to the piezoelectric layer 11 of the later-developed SAW device being thinner than that of the earlier-developed SAW device. Hence, the later-developed SAW device still needs to be further improved at least by suppressing the spurious modes.

SUMMARY

Therefore, an object of the disclosure is to provide a surface acoustic wave device that can alleviate or eliminate at least one of the drawbacks of the prior art.

According to the disclosure, a surface acoustic wave device includes: a substrate that has a top surface and that contains a plurality of protrusions protruding from the top surface and spaced apart from each other; an intermediate layer disposed on the substrate so as to fill a recess formed among the protrusions; a piezoelectric layer disposed on the intermediate layer opposite to the substrate; and an electrode layer disposed on the piezoelectric layer opposite to the intermediate layer.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
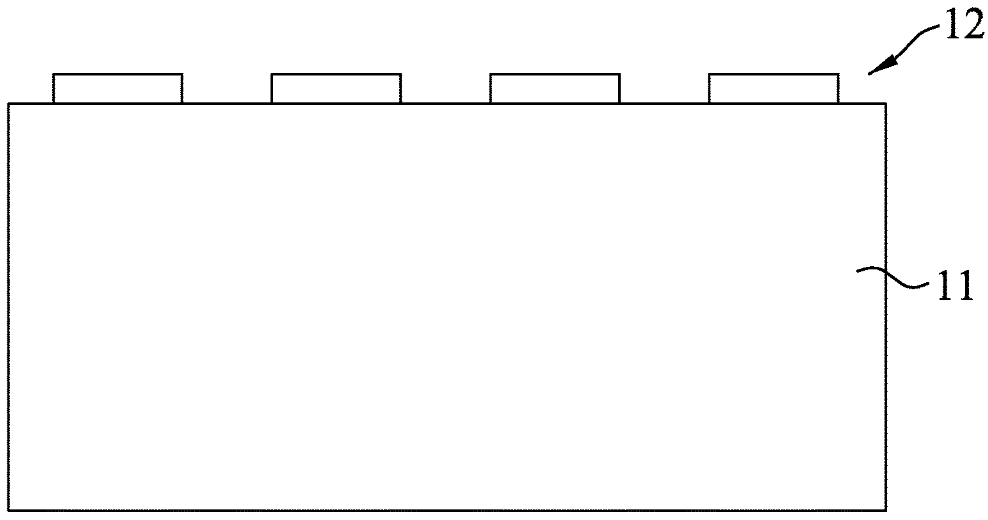
FIG. 1 is a schematic view illustrating an earlier-developed surface acoustic wave (SAW) device.
Figure 2:
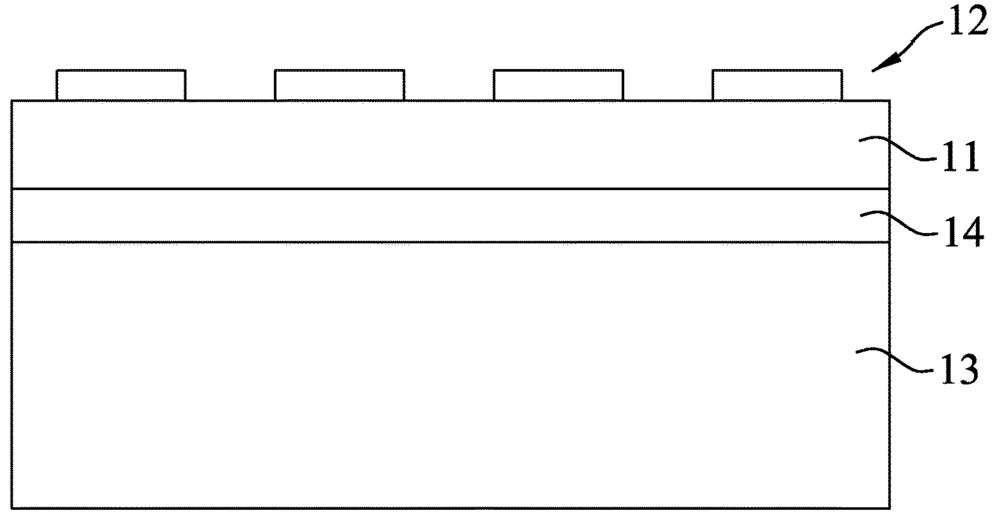
FIG. 2 is a schematic view illustrating a later-developed SAW device.

Before the disclosure is described in greater detail, it should be noted that where considered appropriate, reference numerals or terminal portions of reference numerals have been repeated among the figures to indicate corresponding or analogous elements, which may optionally have similar characteristics.

Figure 5:
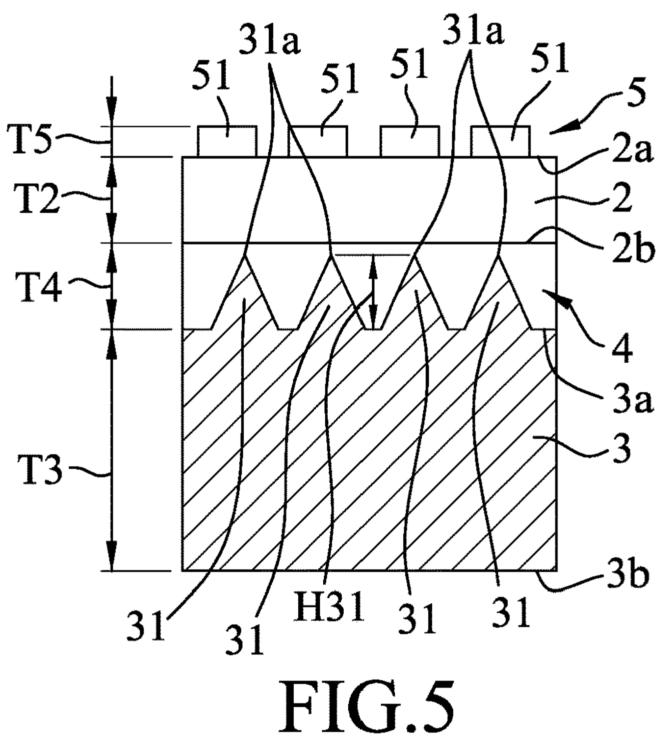
FIG. 5 is a schematic view illustrating a first embodiment of a SAW device of the disclosure.
Figure 6:
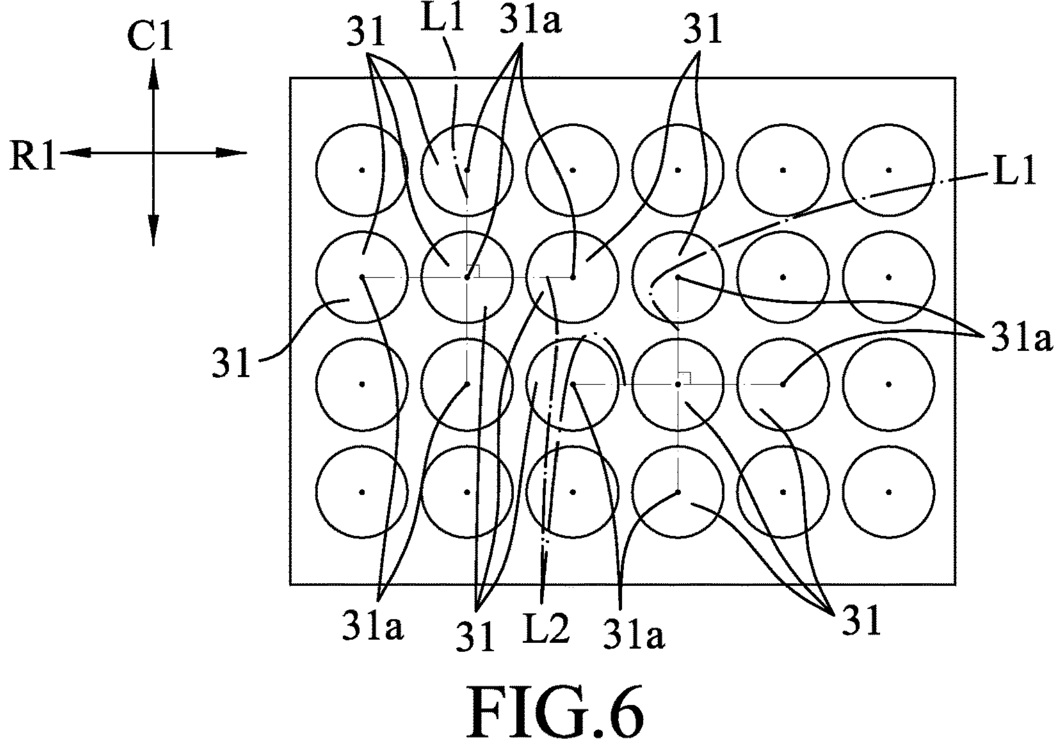
FIG. 6 is a schematic top view of the SAW device shown in FIG. 5.

Referring to FIGS. 5 and 6, a first embodiment of a surface acoustic wave (SAW) device according to the disclosure is illustrated. The SAW device is adapted to be operated with an acoustic wave having a wavelength (A) of substantially 4.2 μm. As shown in FIG. 5, the SAW device includes a substrate 3, an intermediate layer 4, a piezoelectric layer 2 and an electrode layer 5. The substrate 3 has a top surface **3*a* and a bottom surface 3*b* opposite to the top surface 3*a*, and includes a plurality of protrusions 31 protruding from the top surface 3*a* and spaced apart from each other. The intermediate layer 4 is disposed on the substrate 3 so as to fill a recess formed among the protrusions 31. The piezoelectric layer 2 is disposed on the intermediate layer 4 opposite to the substrate 3. The electrode layer 5 is disposed on the piezoelectric layer 2 opposite to the intermediate layer 4**.

The piezoelectric layer 2 has a top surface **2*a* and a bottom surface 2*b* opposite to the top surface 2*a*, and is made of a piezoelectric material for exhibiting piezoelectricity. In this embodiment, the piezoelectric material is exemplified by $LiTaO_3$, but is not limited thereto. In some embodiments, the piezoelectric layer 2 may be made of $LiNbO_3$. The piezoelectric layer 2 may have a thickness (T2) of one-quarter of the wavelength (λ/4) of the acoustic wave, i.e., approximately 1.68 μm. In some embodiments, the thickness (T2) of the piezoelectric layer 2** may range from 0.1 μm to 30 μm.

In this embodiment, the substrate 3 is made of single crystal $Al_2O_3$, which is often referred to as sapphire, but is not limited thereto, and the substrate 3 has a thickness (T3) of 200 μm. In some embodiments, the substrate 3 may be made of a diamond-like carbon-based material, such as silicon carbide (SiC), and the thickness (T3) of the substrate 3 may range from 100 μm to 1 mm.

In this embodiment, each of the protrusions 31 extends into the intermediate layer 4, and has a conical shape, but is not limited thereto. Each of the protrusions 31 has a height (H31) of 1.8 μm, and an apex 31*a* not in touch with the bottom surface 2*b* of the piezoelectric layer 2. That is to say, the apex 31*a* of each of the protrusions 31 is spaced apart from the bottom surface 2*a* of the piezoelectric layer 2. In some embodiments, the protrusions 31 may be in a pyramidal shape with square, rectangular and other geometric cross-sections, such as a square pyramid, and a pentagonal pyramid, etc. In some embodiments, each of the protrusions 31 may have a height (H31) which is measured from the top surface 3*a*, and which ranges from 0.5 μm to 3 μm.

As shown in FIG. 6, in this embodiment, the substrate 3 defines a longitudinal direction C1 and a transverse direction R1 that is perpendicular to the longitudinal direction C1, and the protrusions 31 are arranged in the longitudinal direction C1 and the transverse direction R1. In this embodiment, at least one of the protrusions 31 is interposed between two adjacent ones of the protrusions 31 in the longitudinal direction C1, and is interposed between another two adjacent ones of the protrusions 31 in the transverse direction R1. The apex 31*a* of the at least one of the protrusions 31 and the apices 31*a* of the two adjacent ones of the protrusions 31 in the longitudinal direction C1 are connected to define a first line L1. The apex 31*a* of the at least one of the protrusions 31 and the apices 31*a* of the two adjacent ones of the protrusions 31 in the transverse direction R1 are connected to define a second line L2. The first line L1 is perpendicular to the second line L2.

As shown in FIG. 5, the intermediate layer 4 is a single layer that is made of a material selected from silicon, silicon dioxide, silicon nitride, and aluminum nitride. In this embodiment, the intermediate layer 4 is made of silicon dioxide and has a thickness (T4) of substantially 0.45λ, i.e., approximately 1.89 μm. The thickness (T4) of the intermediate layer 4 is larger than the height (H31) of each of the protrusions 31 so as to ensure the apices 31*a* of the protrusions 31 not being in touch with the bottom surface 2*b* of the piezoelectric layer 2. In some embodiments, the thickness (T4) of the intermediate layer 4 may range from 1 μm to 20 μm.

In this embodiment, the electrode layer 5 has a thickness (T5) of 300 nm, and is formed as an interdigital electrode structure including a plurality of electrode fingers 51. In some embodiments, the electrode layer 5 may have a thickness (T5) ranging from 10 nm to 5000 nm. Moreover, the shape and number of the electrode fingers 51 may be adjusted by one of ordinary skilled in the art in actual practice and are not the essential features of the disclosure, and thus, detailed description thereof is omitted herein.

Figure 7:
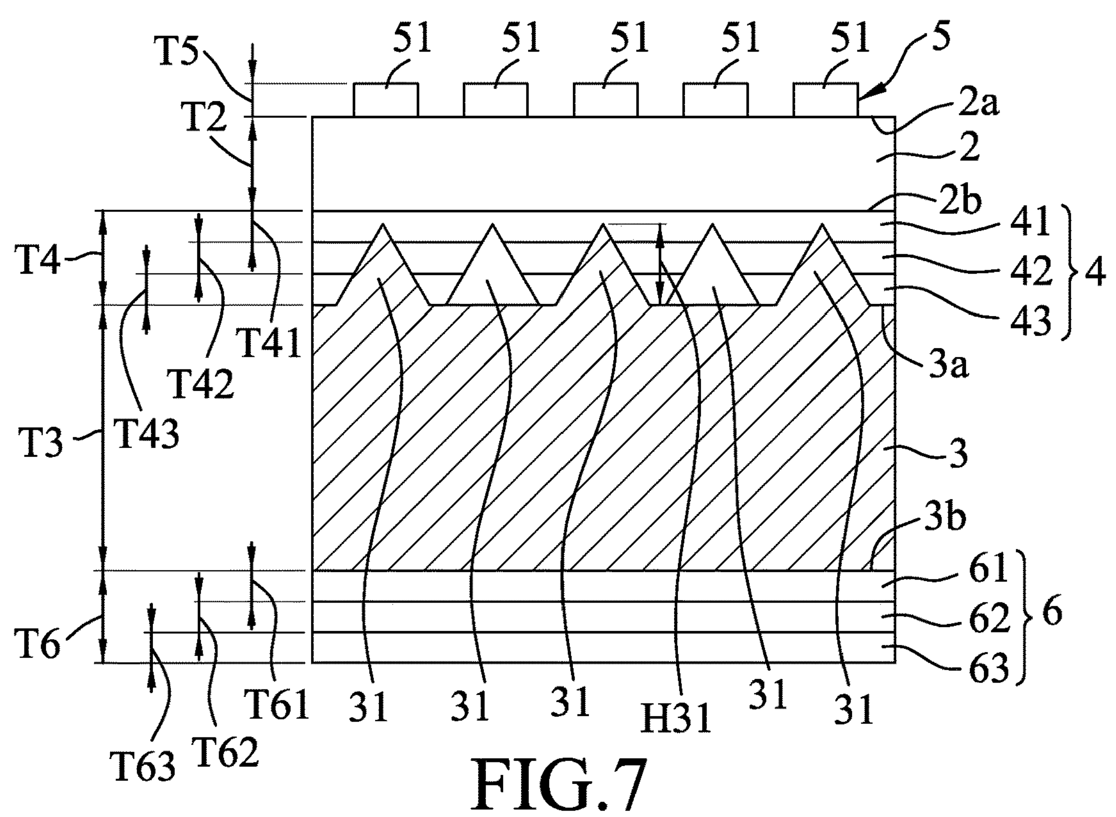
FIG. 7 is a schematic view illustrating a second embodiment of the SAW device of the disclosure.
Figure 8:
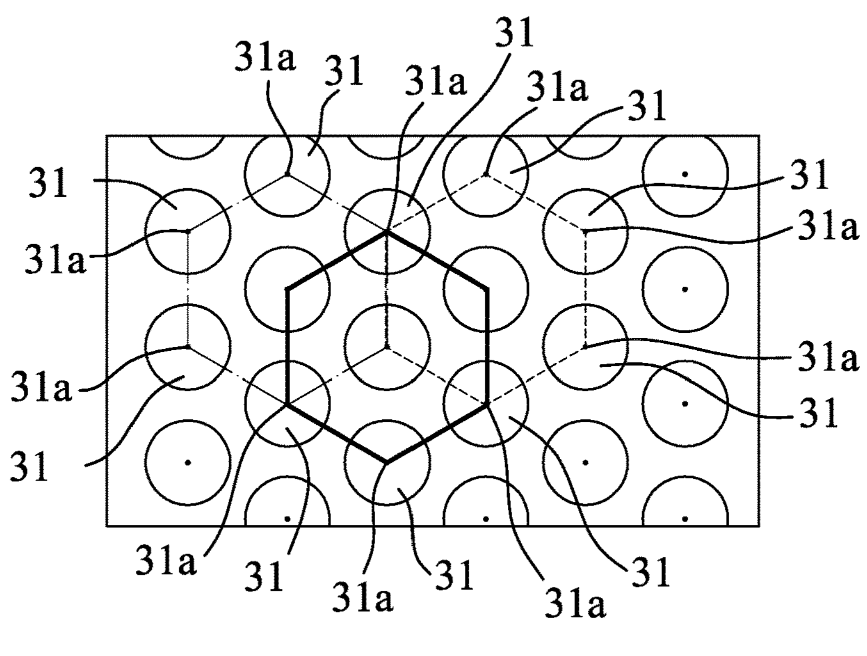
FIG. 8 is a schematic top view of the SAW device shown in FIG. 7.

Referring to FIGS. 7 and 8, a second embodiment of the SAW device has a structure similar to that of the first embodiment of the SAW device. However, the intermediate layer 4 is formed as a tri-layered structure, the protrusions 31 of the substrate 3 are arranged in a different manner, and the second embodiment of the SAW device further includes a multi-layered element 6.

The intermediate layer 4 includes a top layer 41 being in contact with the piezoelectric layer 2, a bottom layer 43 being in contact with the substrate 3, and a middle layer 42 interposed between the top layer 41 and the bottom layer 43. The protrusions 31 extend through the bottom layer 43 and the middle layer 42, and are surrounded by the top layer 41. Each of the top, middle and bottom layers 41, 42, 43 of the intermediate layer 4 is made of a material independently selected from silicon, silicon dioxide, silicon nitride, and aluminum nitride. In this embodiment, each of the top and bottom layers 41, 43 is made of aluminum nitride, and the middle layer 42 is made of silicon dioxide, so that the middle layer 42 has an acoustic propagation velocity lower than that of each of the top and bottom layers 41, 43. In terms of thickness, the top layer 41 has a thickness (T41) of 600 nm, the bottom layer 43 has a thickness (T43) of 600 nm, and the middle layer 42 has a thickness (T42) of 500 nm. Thus, the intermediate layer 4 has a thickness (T4) of 1700 nm (i.e., 1.7 μm) in total. In some embodiments, the intermediate layer 4 may have a thickness (T4) ranging from 1.5 μm to 10 μm.

In this embodiment, protrusions 31 are equidistant from each other, and at least one of the protrusions 31 is self-centered to be surrounded by six adjacent ones of the protrusions 31 that are equiangular to each other, as shown in FIG. 8. To be specific, the apices 31*a* of the six adjacent ones of the protrusions 31 are configured as a regular hexagon.

The multi-layered element 6 is made of a material selected from silicon, silicon dioxide, silicon nitride, and aluminum nitride. In this embodiment, the multi-layered element 6 includes an upper layer 61 being in contact with the bottom surface 3*b* of the substrate 3, a lower layer 63 opposite to the upper layer 61, and a middle layer 62 interposed between the upper layer 61 and the lower layer 63. Each of the upper, middle and lower layers 61, 62, 63 of the multi-layered element 6 is made of a material independently selected from silicon, silicon dioxide, silicon nitride, and aluminum nitride. In this embodiment, each of the upper and lower layers 61, 63 is made of aluminum nitride, and the middle layer 62 is made of silicon dioxide, so that the middle layer 62 has an acoustic propagation velocity lower than that of each of the upper and lower layers 61, 63. In terms of thickness, the upper layer 61 has a thickness (T61) of 100 nm, the lower layers 63 has a thickness (T63) of 100 nm, and the middle layer 62 has a thickness (T62) of 200 nm. Thus, the multi-layered element 6 has a thickness (T6) of 400 nm in total.

Figure 9:
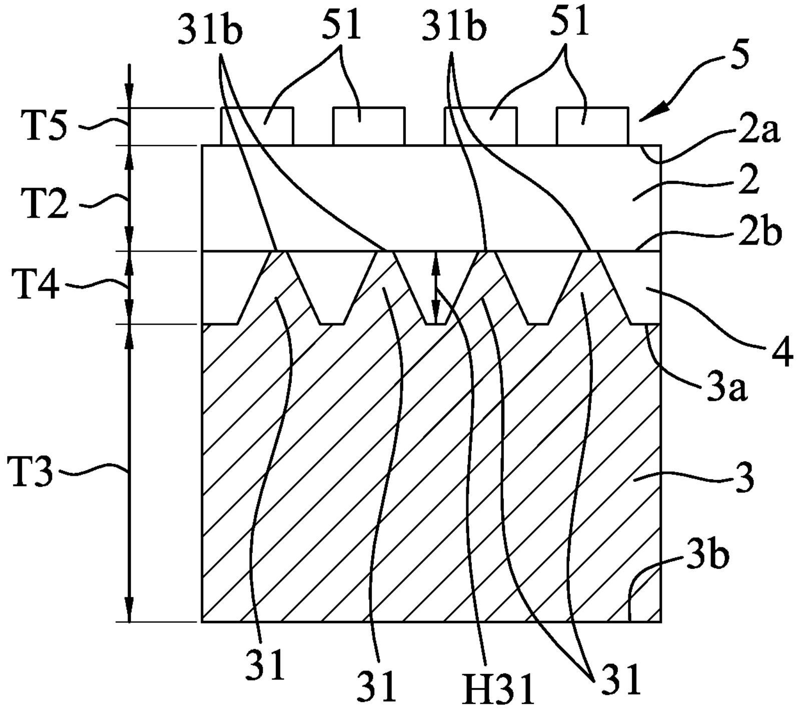
FIG. 9 is a schematic view illustrating a third embodiment of the SAW device of the disclosure.

Referring to FIG. 9, a third embodiment of the SAW device has a structure similar to that of the first embodiment of the SAW device, except that each of the protrusions 31 has a truncated-conical shape. In some embodiments, each of the protrusions 31 may have a truncated-pyramidal shape with a top end 31*b*. In this embodiment, the height (H31) of each of the protrusions 31 is 1.5 μm, and the top end 31*b* of each of the protrusions 31 is terminated at the bottom surface 2*b* of the piezoelectric layer 2. That is to say, the height (H31) of each of the protrusions 31 is the same as the thickness (T4) of the intermediate layer 4.

Figure 10:
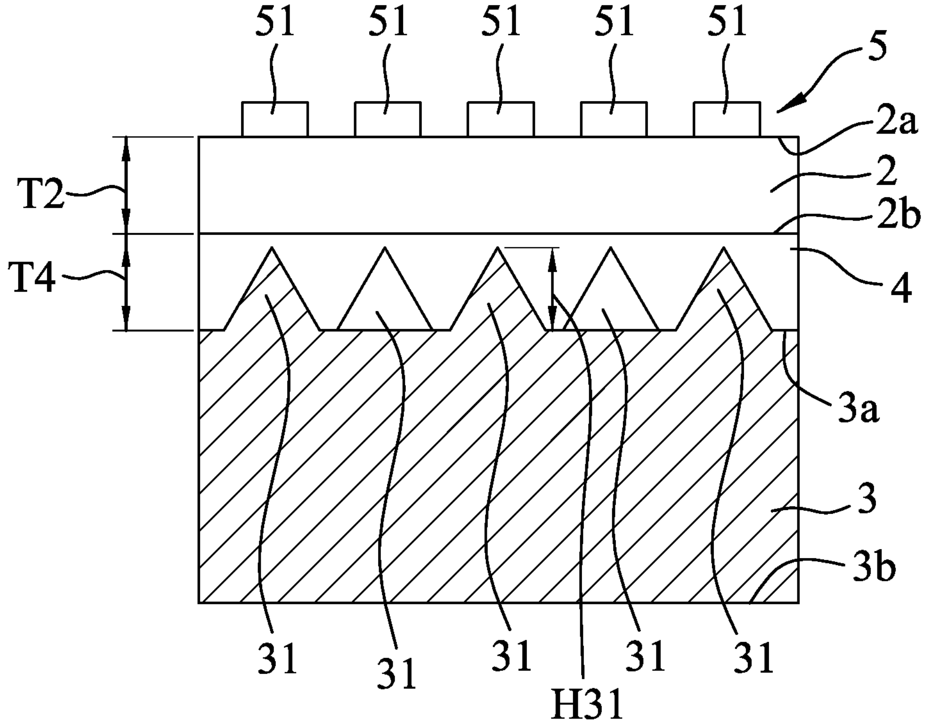
FIG. 10 is a schematic view illustrating a fourth embodiment of the SAW device of the disclosure.

Referring to FIG. 10, a fourth embodiment of the SAW device has a structure similar to that of the first embodiment of the SAW device, except that each of the protrusions 31 is configured as shown in FIG. 8. To be specific, the apices (31) of six adjacent ones of the protrusions 31 are configured as a regular hexagon.

Figure 3:
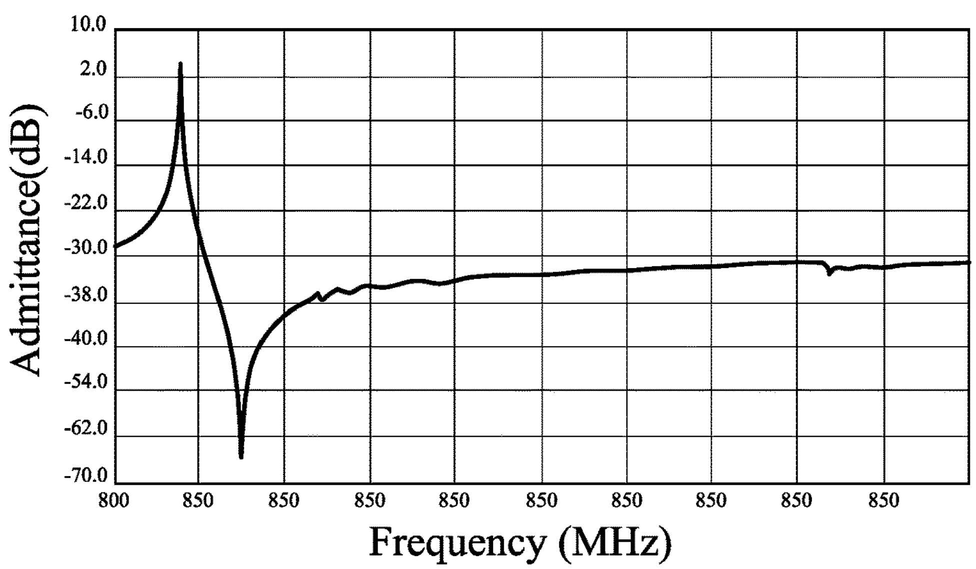
FIG. 3 is a graph illustrating simulated admittance versus frequency of a resonator made from the earlier-developed SAW device shown in FIG. 1.
Figure 4:
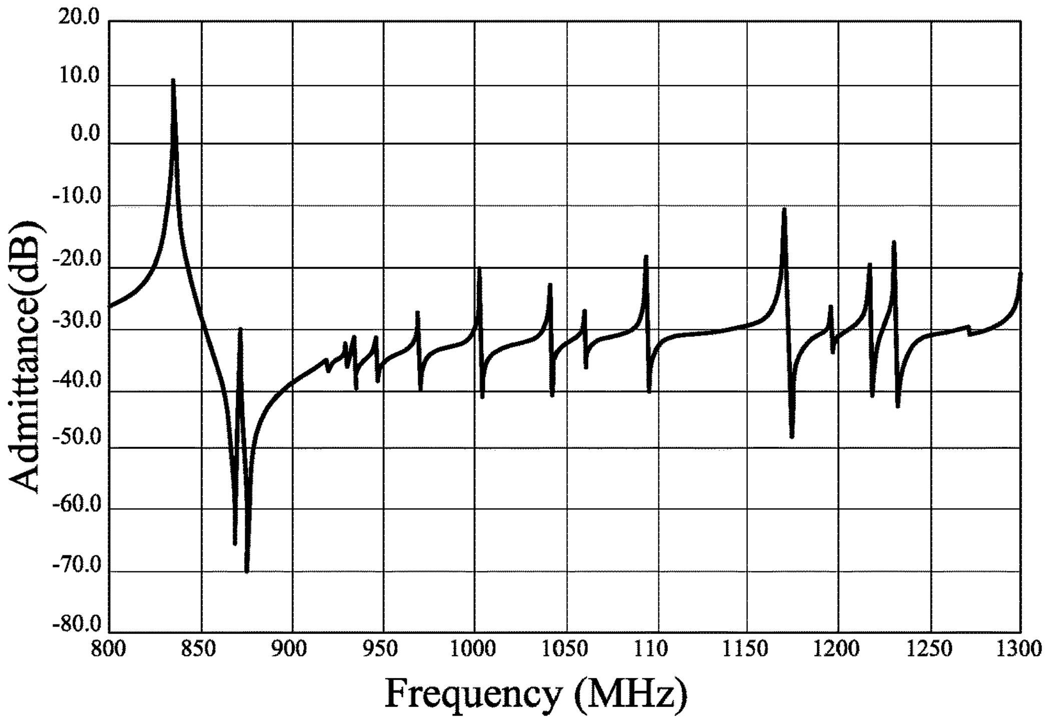
FIG. 4 graph is a illustrating simulated admittance versus frequency of a resonator made from the later-developed SAW device shown in FIG. 2.
Figure 11:
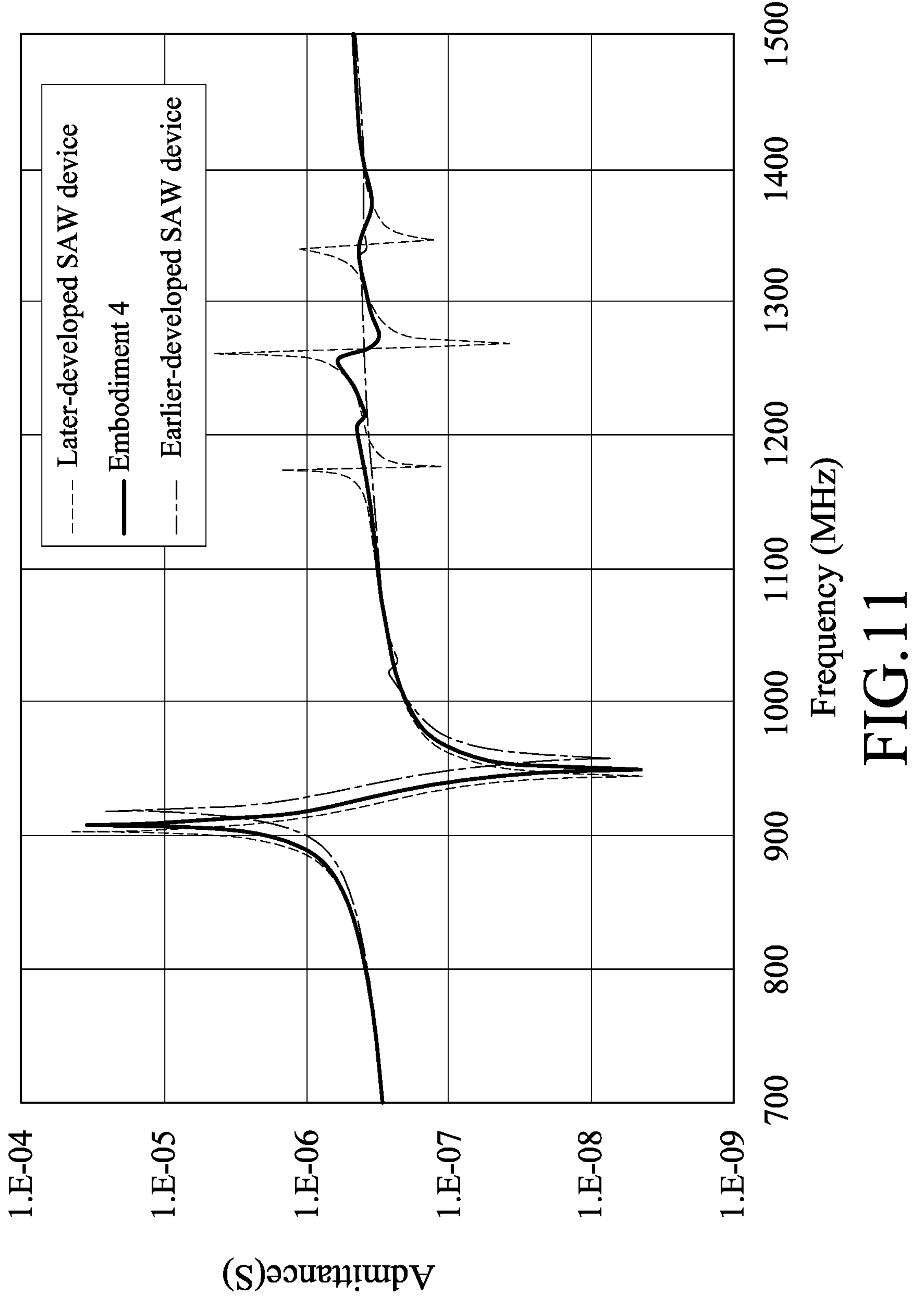
FIG. 11 is a graph illustrating simulated admittance versus frequency of a resonator made from the fourth embodiment of the SAW device shown in FIG. 10 compared with those of the resonator made from the earlier-developed SAW device shown in FIG. 1 and the resonator made from the later-developed SAW device shown in FIG. 2.

Referring to FIG. 11, a vertical axis indicates admittance (unit: siemens, S), which is reciprocal of impedance. The admittance in siemens(S) in FIG. 11 and the admittance in decibel (dB) in FIGS. 3 and 4 have a relation of $dB=20 \log_{10}(S)$. Evidently, the later-developed SAW device has a higher Q factor but exhibits a plurality of spurious modes, compared with the earlier-developed SAW device, where Q factor is a parameter that describes the quality of a resonator. Q factor is defined by frequency-to-bandwidth ratio ($Q=f_0/\Delta f$), where $f_0$ is center frequency of a resonator at which the real part of the impedance reaches its maximum and $\Delta f$ is a bandwidth measured at −3 dB from a peak value at the center frequency. The higher the Q factor is, the sharper the peak is. By contrast, the fourth embodiment of the SAW device of the disclosure not only has a high Q factor but also exhibits mitigated spurious modes.

In summary, the SAW device of this disclosure, by having a plurality of the protrusions 31 protruding from the top surface 3*a* of the substrate 3 and spaced apart from each other, can effectively suppress the formation of spurious modes.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A surface acoustic wave device, comprising:

a substrate that has a top surface and that includes a plurality of protrusions protruding from said top surface and spaced apart from each other;

an intermediate layer disposed on said substrate so as to fill a recess formed among said protrusions;

a piezoelectric layer disposed on said intermediate layer opposite to said substrate; and an electrode layer disposed on said piezoelectric layer opposite to said intermediate layer, wherein said intermediate layer includes a top layer being in contact with said piezoelectric layer, a bottom layer being in contact with said substrate, and a middle layer interposed between said top layer and said bottom layer, and wherein said middle layer of said intermediate layer has an acoustic propagation velocity lower than that of each of said top layer and said bottom layer of said intermediate layer.

2. The surface acoustic wave device of claim 1, wherein said substrate defines a longitudinal direction and a transverse direction that is perpendicular to said longitudinal direction, said protrusions being arranged in said longitudinal direction and said transverse direction.

3. The surface acoustic wave device of claim 2, wherein each of said protrusions has an apex, at least one of said protrusions being interposed between two adjacent ones of said protrusions in the longitudinal direction and being interposed between another two adjacent ones of said protrusions in the transverse direction, said apex of said at least one of said protrusions and said apex of each of said two adjacent ones of said protrusions in the longitudinal direction being connected to define a first line, said apex of said at least one of said protrusions and said apex of each of said another two adjacent ones of said protrusions in the transverse direction being connected to define a second line, the first line being perpendicular to the second line.

4. The surface acoustic wave device of claim 1, wherein said protrusions are equidistant from each other, at least one of said protrusions being surrounded by six adjacent ones of said protrusions that are equiangular to each other.

5. The surface acoustic wave device of claim 1, wherein said substrate has a thickness ranging from 100 μm to 1 mm.

6. The surface acoustic wave device of claim 1, wherein each of said protrusions has a height ranging from 0.5 μm to 3 μm, the height being measured from said top surface of said substrate.

7. The surface acoustic wave device of claim 1, wherein said intermediate layer is a single layer that is made of a material selected from silicon, silicon dioxide, silicon nitride, and aluminum nitride.

8. The surface acoustic wave device of claim 1, wherein said intermediate layer has a thickness ranging from 1 μm to 20 μm.

9. The surface acoustic wave device of claim 1, wherein said intermediate layer has a thickness ranging from 1.5 μm to 10 μm.

10. The surface acoustic wave device of claim 1, wherein said protrusions extend through said bottom layer and said middle layer, and are surrounded by said top layer.

11. The surface acoustic wave device of claim 1, wherein each of said top, middle and bottom layers of said intermediate layer is made of a material independently selected from silicon, silicon dioxide, silicon nitride, and aluminum nitride.

12. The surface acoustic wave device of claim 11, wherein each of said top and bottom layers of said intermediate layer is made of aluminum nitride, and said middle layer of said intermediate layer is made of silicon dioxide.

13. The surface acoustic wave device of claim 1, wherein said substrate has a bottom surface opposite to said top surface, said surface acoustic wave device further including a multi-layered element that is made of a material selected from silicon, silicon dioxide, silicon nitride, and aluminum nitride.

14. The surface acoustic wave device of claim 13, wherein said multi-layered element has an upper layer being in contact with said bottom surface, a lower layer opposite to said upper layer, and a middle layer interposed between said upper layer and said lower layer.

15. The surface acoustic wave device of claim 14, wherein said middle layer of said multi-layered element has an acoustic propagation velocity lower than that of each of said upper and lower layers of said multi-layered element.

16. The surface acoustic wave device of claim 14, wherein each of said upper, middle and lower layers of said multi-layered element is made of a material independently selected from silicon, silicon dioxide, silicon nitride, and aluminum nitride.

17. The surface acoustic wave device of claim 16, wherein each of said upper and lower layers of said multi-layered element is made of aluminum nitride, and said middle layer of said multi-layered element is made of silicon dioxide.

18. The surface acoustic wave device of claim 1, wherein each of said protrusions has a conical or pyramidal shape.

19. The surface acoustic wave device of claim 1, wherein each of said protrusions has a truncated-conical or truncated-pyramidal shape.

20. A surface acoustic wave device, comprising:

a substrate that has a top surface and that includes a plurality of protrusions protruding from said top surface and spaced apart from each other;

an intermediate layer disposed on said substrate so as to fill a recess formed among said protrusions;

a piezoelectric layer disposed on said intermediate layer opposite to said substrate; and an electrode layer disposed on said piezoelectric layer opposite to said intermediate layer, wherein said substrate has a bottom surface opposite to said top surface, said surface acoustic wave device further including a multi-layered element that is made of a material selected from silicon, silicon dioxide, silicon nitride, and aluminum nitride, wherein said multi-layered element has an upper layer being in contact with said bottom surface, a lower layer opposite to said upper layer, and a middle layer interposed between said upper layer and said lower layer, and wherein said middle layer of said multi-layered element has an acoustic propagation velocity lower than that of each of said upper layer and said lower layer of said multi-layered element.

21. The surface acoustic wave device of claim 20, wherein each of said upper layer, said middle layer and said lower layer of said multi-layered element is made of a material independently selected from silicon, silicon dioxide, silicon nitride, and aluminum nitride.

* * * * *